(12) United States Patent
Watanabe

(10) Patent No.: US 7,544,590 B2
(45) Date of Patent: Jun. 9, 2009

(54) WAFER LASER PROCESSING METHOD

(75) Inventor: Yosuke Watanabe, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/892,914

(22) Filed: Aug. 28, 2007

(65) Prior Publication Data

US 2008/0057680 A1  Mar. 6, 2008

(30) Foreign Application Priority Data

Aug. 29, 2006  (JP)  ............................. 2006-232642

(51) Int. Cl.
  *H01L 21/268* (2006.01)
(52) U.S. Cl. ............................. 438/463; 257/E21.347
(58) Field of Classification Search ................. 438/113, 438/463; 257/E21.347
See application file for complete search history.

(56) References Cited

U.S. PATENT DOCUMENTS 6,257,224 B1   7/2001 Yoshino et al.
6,555,447 B2 * 4/2003 Weishauss et al. .......... 438/460

FOREIGN PATENT DOCUMENTS

JP       10-305420       11/1998
JP       3408805         3/2003

\* cited by examiner

*Primary Examiner*—W. David Coleman
(74) *Attorney, Agent, or Firm*—Smith, Gambrell & Russell, LLP

(57) ABSTRACT

A method of carrying out laser processing on a wafer having a plurality of parallel streets on the front surface along the streets, comprising the steps of:
  carrying out a first laser processing step of carrying out laser processing along streets formed in one half area of the wafer by carrying out a laser beam application step for applying a laser beam along the streets by positioning the outermost street on one side in the indexing-feed direction of the wafer right below a condenser and an indexing-feed step for positioning a street adjacent to the street which has undergone the laser beam application step on the wafer right below the condenser sequentially; and
  carrying out a second laser processing step of carrying out laser processing along streets formed in the other half area of the wafer by carrying out a laser beam application step for applying a laser beam along the streets by positioning the outermost street on the other side in the indexing-feed direction of the wafer which has undergone the first laser processing step right below the condenser and an indexing-feed step for positioning a street adjacent to the street which has undergone the laser beam application step on the wafer right below the condenser sequentially.

6 Claims, 12 Drawing Sheets

Fig. 6
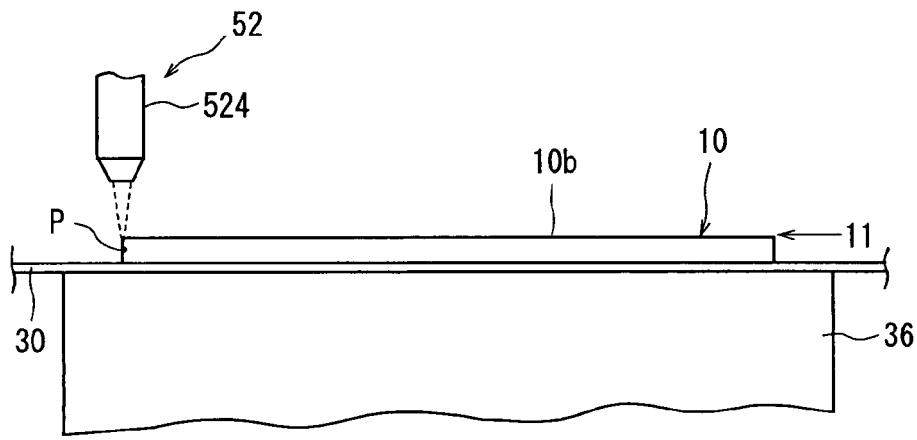
(a)
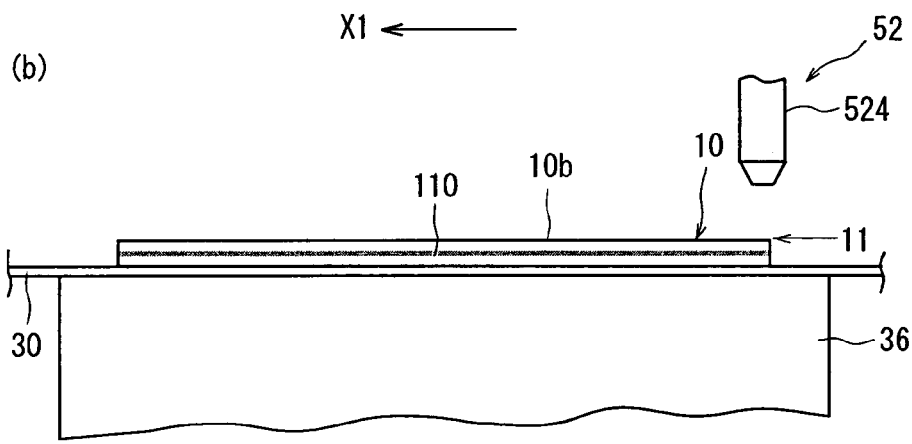
(b)
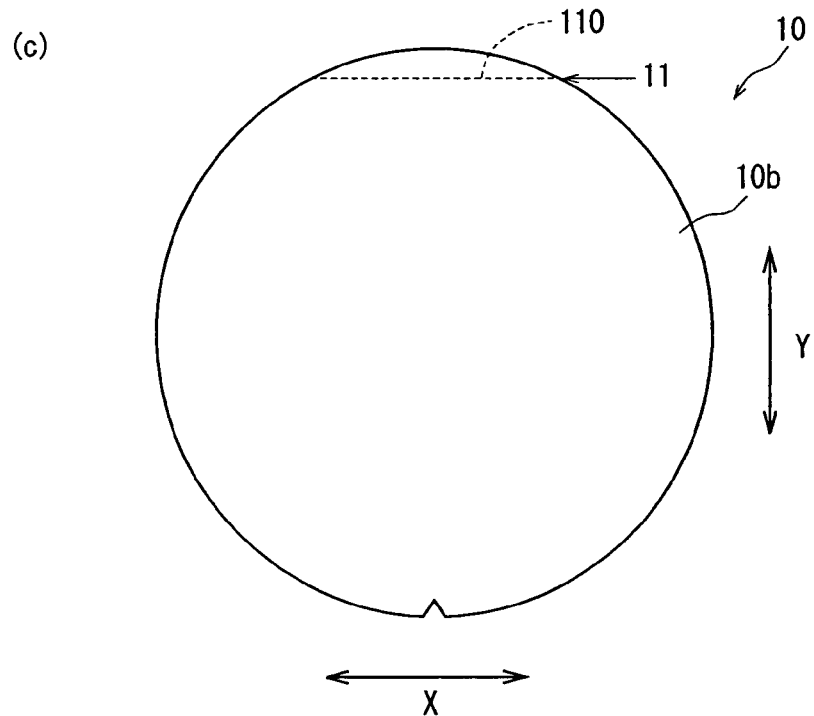
(c)

WAFER LASER PROCESSING METHOD

FIELD OF THE INVENTION

The present invention relates to a method of carrying out laser processing on a wafer along streets by applying a laser beam along the streets formed on the front surface of the wafer held on a chuck table.

DESCRIPTION OF THE PRIOR ART

In the production process of a semiconductor wafer, a plurality of areas are sectioned by dividing lines called "streets" arranged in a lattice pattern on the front surface of a substantially disk-like semiconductor wafer, and a circuit such as IC, LSI or the like is formed in each of the sectioned areas. Individual semiconductor chips are manufactured by cutting this semiconductor wafer along the streets to divide it into the circuit formed areas. An optical device wafer comprising a gallium nitride (or the like)-based compound semiconductor on the front surface of a sapphire substrate is also cut along streets to be divided into individual optical devices such as light emitting diodes, laser diodes or the like which are widely used in electric appliances.

In recent years, as a means of dividing a plate-like workpiece such as a semiconductor wafer and the like, a laser processing method which applies a pulse laser beam having permeability for the workpiece with its focal point set to the inside of the area to be divided is tried and disclosed by JP No. 3408805. In the dividing method using this laser processing technique, the workpiece is divided by applying a pulse laser beam of a wavelength (for example, 1,064 nm) having permeability for the workpiece from one side of the workpiece with its focal point set to the inside of the work piece, which continuously forms deteriorated layers in the workpiece along the streets, and applying external force along the streets whose strength has been reduced by the formation of the deteriorated layers.

As a means of dividing a wafer such as the above semiconductor wafer, optical device wafer or the like along the streets, JP-A 10-305420 discloses a method in which a pulse laser beam of a wavelength (for example, 355 nm) having absorptivity for the wafer is applied along the streets formed on the wafer to form laser processed grooves and the wafer is divided along the laser processed grooves.

When a laser beam is applied along the streets formed on the wafer, the wafer slightly expands in a direction perpendicular to the streets exposed to the laser beam. As a result, the position relationship between the focal point of the laser beam and the streets slightly deviates cumulatively, whereby alignment work for compensating for the deviation caused by the above expansion must be carried out during laser processing work, and hence, there is a problem of reducing productivity.

SUMMARY OF THE INVENTION

It is an object of the present invention to provide a method which carries out laser processing along streets formed on a wafer without carrying out alignment work for compensating for a deviation caused by expansion which occurs by the application of a laser beam.

To attain the above object, according to the present invention, there is provided a method of carrying out laser processing on a wafer having a plurality of parallel streets on the front surface along the streets by using a laser beam processing machine comprising a rotatable chuck table which holds the wafer, a laser beam application means comprising a condenser to apply a laser beam to the wafer held on the chuck table, a processing-feed means which moves the chuck table and the laser beam application means relative to each other in a processing-feed direction, and a indexing-feed means which moves the chuck table and the laser beam application means in an indexing-feed direction perpendicular to the processing-feed direction, the method comprising:

the wafer holding step of affixing a protective member to the front surface or rear surface of the wafer and holding the protective member side of the wafer on the chuck table;

the wafer positioning step of making streets formed on the wafer held on the chuck table parallel to the feed direction;

the first laser processing step of carrying out laser processing along streets formed in one half area of the wafer by carrying out a laser beam application step which carries out laser processing along the streets by positioning the outermost street on one side in the indexing-feed direction of the wafer which has undergone the wafer positioning step right below the condenser and moving the chuck table in the processing-feed direction by activating the processing-feed means while a laser beam is applied from the condenser and an indexing-feed step which positions a street adjacent to the street which has undergone the laser beam application step on the wafer held on the chuck table right below the condenser by activating the indexing-feed means sequentially; and the second laser processing step which carries out laser processing along streets formed in the other half area of the wafer for carrying out a laser beam application step for carrying out laser processing along the streets by positioning the outermost street on the other side in the indexing-feed direction of the wafer which has undergone the first laser processing step right below the condenser and moving the chuck table in the processing-feed direction by activating the processing-feed means while a laser beam is applied from the condenser and an indexing-feed step which positions a street adjacent to the street which has undergone the laser beam application step on the wafer held on the chuck table right below the condenser by activating the indexing-feed means sequentially.

The plurality of parallel streets formed on the wafer consist of first streets formed in a first direction and second streets formed in a second direction perpendicular to the first streets.

The above laser beam application means applies a laser beam of a wavelength having permeability for the wafer in the laser beam application step with its focal point set to the inside of the wafer to form a deteriorated layer along the streets in the wafer.

The above laser beam application means applies a laser beam of a wavelength having absorptivity for the wafer in the laser beam application step to form a laser processed groove along the streets in the wafer.

When the laser beam application step is carried out, the wafer slightly expands in a direction perpendicular to the street which has undergone the laser processing. However, in the wafer laser processing method of the present invention, the first laser processing step which carries out laser processing from the outermost street on one side in the indexing-feed direction of the wafer held on the chuck table to a street in the center area sequentially and the second laser processing step which carries out laser processing from the outermost street on the other side in the indexing-feed direction of the wafer to a street in the center area sequentially are carried out and hence, the step of applying a laser beam along a street in the largest center area comes last in the first laser processing step and the second laser processing step. Although the wafer affixed to the protective member displaces in the direction perpendicular to the streets, it displaces to the side having a relatively small area, therefore, the position relationship between the focal point of a laser beam and the street does not deviate cumulatively. Consequently, when alignment between the street and the focal spot of a laser beam applied from the condenser is first carried out, displacement caused by the expansion of the wafer due to the application of a laser beam does not need to be compensated for during the first laser processing step and the second laser processing step.

BRIEF DESCRIPTION OF THE DRAWINGS

FIGS. 6(a) and 6(b) and 6(c) are explanatory diagrams showing the laser beam application step in the first laser processing step in the first embodiment of the wafer laser processing method of the present invention;

DETAILED DESCRIPTION OF THE PREFERRED EMBODIMENTS

Preferred embodiments of the present invention will be described in more detail with reference to the accompanying drawings.

Figure 1:
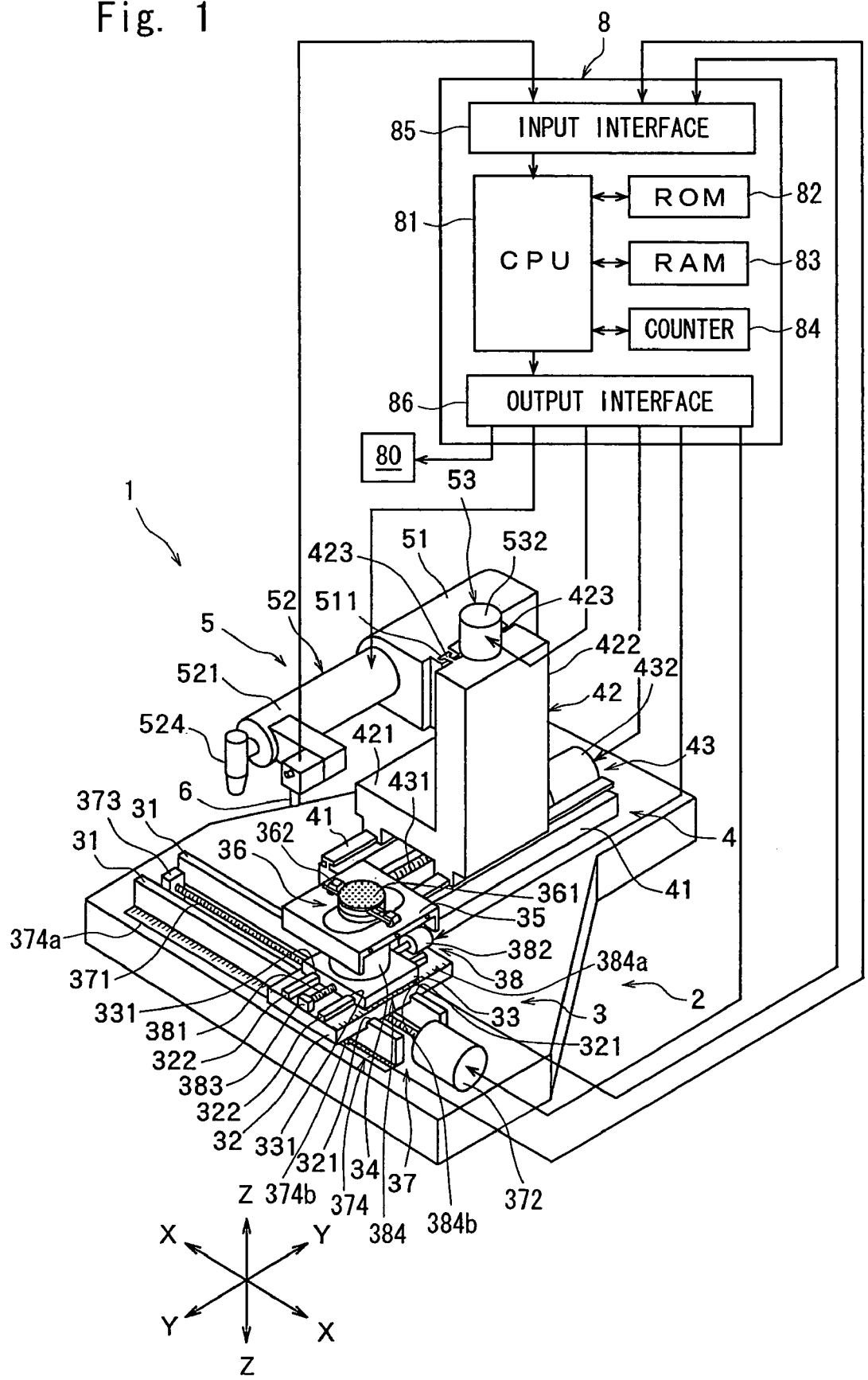
FIG. 1 is a perspective view of a laser beam processing machine for carrying out the wafer laser processing method of the present invention.

FIG. 1 is a perspective view of a laser beam processing machine for carrying out the wafer laser processing method of the present invention. The laser beam processing machine 1 shown in FIG. 1 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4 mounted on the stationary base 2 in such a manner that it can move in an indexing-feed direction indicated by an arrow Y perpendicular to the direction indicated by the arrow X, and a laser beam application unit 5 mounted on the laser beam application unit support mechanism 4 in such a manner that it can move in a direction indicated by an arrow Z.

The above chuck table mechanism 3 comprises a pair of guide rails 31 and 31 mounted on the stationary base 2 and arranged parallel to each other in the processing-feed direction indicated by the arrow X, a first sliding block 32 mounted on the guide rails 31 and 31 in such a manner that it can move in the processing-feed direction indicated by the arrow X, a second sliding block 33 mounted on the first sliding block 32 in such a manner that it can move in the indexing-feed direction indicated by the arrow Y, a cover table 35 supported on the second sliding block 33 by a cylindrical member 34, and a chuck table 36 as a workpiece holding means. This chuck table 36 comprises an adsorption chuck 361 made of a porous material, and a workpiece, for example, a disk-like semiconductor wafer is held on the adsorption chuck 361 by a suction means that is not shown. The chuck table 36 constituted as described above is rotated by a pulse motor (not shown) installed in the cylindrical member 34. The chuck table 36 is provided with clamps 362 for fixing an annular frame which will be described later.

The above first sliding block 32 has on the undersurface a pair of to-be-guided grooves 321 and 321 to be fitted to the above pair of guide rails 31 and 31 and on the top surface a pair of guide rails 322 and 322 formed parallel to each other in the indexing-feed direction indicated by the arrow Y. The first sliding block 32 is constituted so that it can move along the pair of guide rails 31 and 31 in the processing-feed direction indicated by the arrow X when the to-be-guided grooves 321 and 321 are fitted to the pair of guide rails 31 and 31, respectively. The chuck table mechanism 3 in the illustrated embodiment comprises a processing-feed means 37 which can move the first sliding block 32 along the pair of guide rails 31 and 31 in the processing-feed direction indicated by the arrow X. The processing-feed means 37 comprises a male screw rod 371 arranged between the above pair of guide rails 31 and 31 in parallel thereto and a drive source such as a pulse motor 372 for rotary-driving the male screw rod 371. The male screw rod 371 is, at it's one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The laser beam processing machine 1 in the illustrated embodiment comprises a processing-feed amount detection means 374 for detecting the processing-feed amount of the above chuck table 36. The processing-feed amount detection means 374 comprises a linear scale 374a arranged along the guide rail 31 and a read head 374b which is mounted on the first sliding block 32 and moves along the linear scale 374a together with the first sliding block 32. The read head 374b of this processing-feed amount detection means 374 supplies one pulse signal for every 1 μm to a control means which will be described later in the illustrated embodiment. The control means described later counts the input pulse signals to detect the processing-feed amount of the chuck table 36. When the pulse motor 372 is used as a drive source for the above processing-feed means 37, the processing-feed amount of the chuck table 36 can be detected by counting the drive pulses of the control means described later for outputting a drive signal to the pulse motor 372. When a servo motor is used as a drive source for the above processing-feed means 37, pulse signals outputted from a rotary encoder for detecting the revolution of the servo motor are supplied to the control means described later and the control means counts the input pulse signals, thereby making possible to detect the processing-feed amount of the chuck table 36.

The above second sliding block 33 has on the undersurface a pair of to-be-guided grooves 331 and 331 to be fitted to the pair of guide rails 322 and 322 on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 along the pair of guide rails 322 and 322 on the first sliding block 32 in the indexing-feed direction indicated by the arrow Y. The first indexing-feed means 38 comprises a male screw rod 381 which is arranged between the above pair of guide rails 322 and 322 in parallel thereto and a drive source such as a pulse motor 382 for rotary-driving the male screw rod 381. The male screw rod 381 is, at it's one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The laser beam processing machine 1 in the illustrated embodiment comprises an indexing-feed amount detection means 384 for detecting the indexing-feed amount of the above second sliding block 33. This indexing-feed amount detection means 384 comprises a linear scale 384a arranged along the guide rail 322 and a read head 384b which is mounted on the second sliding block 33 and moves along the linear scale 384a together with the second sliding block 33. The read head 384b of the indexing-feed amount detection means 384 supplies one pulse signal for every 1 μm to the control means described later in the illustrated embodiment. The control means described later counts the input pulse signals to detect the indexing-feed amount of the chuck table 36. When the pulse motor 382 is used as a drive source for the above first indexing-feed means 38, the indexing-feed amount of the chuck table 36 can be detected by counting the drive pulses of the control means described later for outputting a drive signal to the pulse motor 382. When a servo motor is used as a drive source for the above first indexing-feed means 38, pulse signals outputted from a rotary encoder for detecting the revolution of the servo motor are supplied to the control means described later and the control means counts the input pulse signals, thereby making possible to detect the processing-feed amount of the chuck table 36.

The above laser beam application unit support mechanism 4 comprises a pair of guide rails 41 and 41 mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment comprises a second indexing means 43 for moving the movable support base 42 along the pair of guide rails 41 and 41 in the indexing-feed direction indicated by the arrow Y. This second indexing-feed means 43 comprises a male screw rod 431 arranged between the above pair of guide rails 41 and 41 in parallel thereto and a drive source such as a pulse motor 432 and the like for driving the male screw rod 431. The male screw rod 431 is, at it's one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the under surface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 is provided with a pair of guide grooves 511 and 511 to be slidably fitted to the pair of guide rails 423 and 423 on the above mounting portion 422 and is supported in such a manner that it can move in the direction indicated by the arrow Z by fitting the guide grooves 511 and 511 to the above guide rails 423 and 423, respectively.

The laser beam application unit 5 in the illustrated embodiment comprises a moving means 53 for moving the unit holder 51 along the pair of guide rails 423 and 423 in the direction indicated by the arrow Z (Z direction). The moving means 53 comprises a male screw rod (not shown) arranged between the above pair of guide rails 423 and 423 and a drive source such as a pulse motor 532 and the like for rotary-driving the male screw rod. By driving the male screw rod (not shown) in a normal direction or reverse direction with the pulse motor 532, the unit holder 51 and the laser beam application means 52 are moved along the guide rails 423 and 423 in the direction indicated by the arrow Z (Z direction). In the illustrated embodiment, the laser beam application means 52 is moved up by driving the pulse motor 532 in the normal direction and moved down by driving the pulse motor 532 in the reverse direction.

Figure 2:
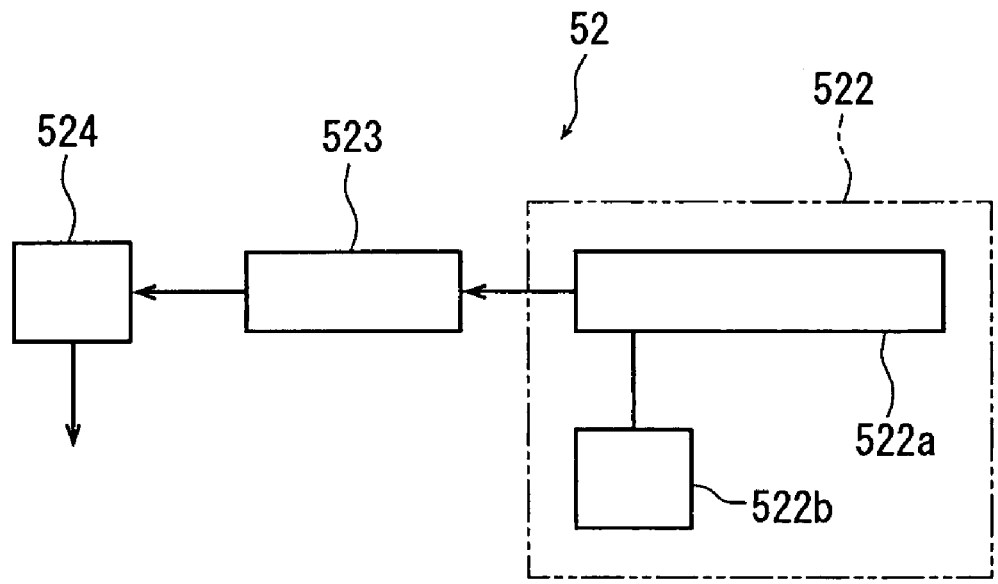
FIG. 2 is a thematic block diagram showing the composition of a laser beam application means provided in the laser beam processing machine shown in FIG. 1.

The illustrated laser beam application means 52 comprises a cylindrical casing 521 extending substantially horizontally. The laser beam application means 52 comprises a pulse laser beam oscillation means 522 and a transmission optical system 523 installed in the casing 521 as shown in FIG. 2 and a condenser 524 for applying a pulse laser beam oscillated by the pulse laser beam oscillation means 522 to the workpiece held on the above chuck table 36, which is attached to the front end of the casing 521. The above pulse laser beam oscillation means 522 comprises a pulse laser beam oscillator 522a composed of a YAG laser oscillator or YVO4 laser oscillator and a cyclic frequency setting means 522b connected to the pulse laser beam oscillator 522a. The cyclic frequency setting means 522b is controlled by the control means described later. The transmission optical system 523 comprises a suitable optical element such as a beam splitter.

Returning to FIG. 1, an image pick-up means 6 for detecting the area to be processed by the laser beam application means 52 is mounted to the front end portion of the casing 521 constituting the above laser beam application means 52. This image pick-up means 6 comprises a infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is supplied to the control means 8.

The control means 8 is composed of a computer which comprises a central processing unit (CPU) 81 for carrying out arithmetic processing based on a control program, a read-only memory (ROM) 82 for storing the control program, etc., a read/write random access memory (RAM) 83 for storing data on the design values of the workpiece which will be described later and the results of operations, etc., a counter 84, an input interface 85 and an output interface 86. Detection signals from the above processing-feed amount detection means 374, the indexing-feed amount detection means 384 and the image pick-up means 6 are applied to the input interface 85 of the control means 8. Control signals are output from the output interface 86 of the control means 8 to input to the above pulse motor 372, the pulse motor 382, the pulse motor 432, the pulse motor 532, the laser beam application means 52 and display means 80, etc. The above random access memory (RAM) 83 has a storage area for storing data on detection values and processing conditions which will be described later.

Figure 3:
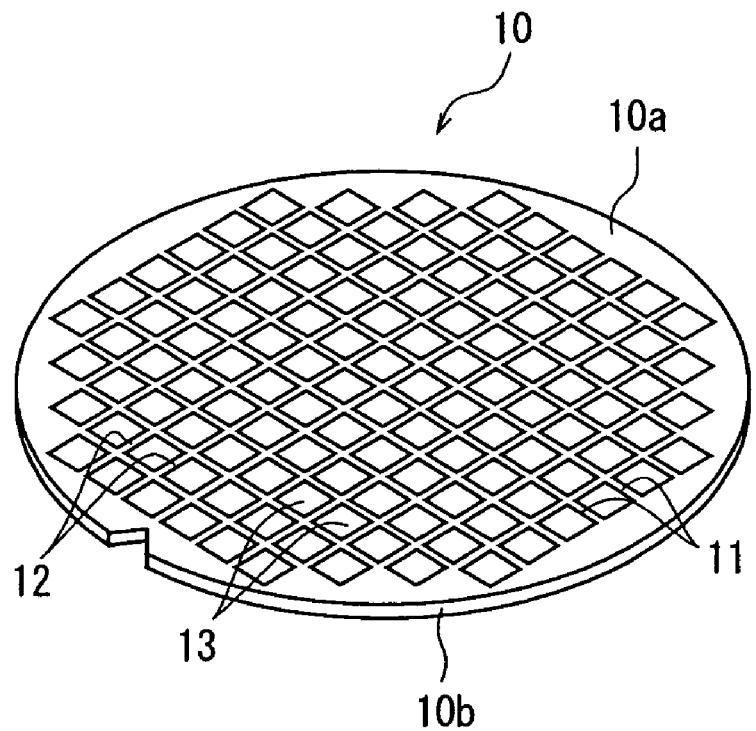
FIG. 3 is a perspective view of a semiconductor wafer as a wafer to be processed by the wafer laser processing method of the present invention.

A semiconductor wafer as the wafer to be processed by the above-described laser beam processing machine 1 will be described with reference to FIG. 3. The semiconductor wafer 10 shown in FIG. 3 is, for example, a silicon wafer having a thickness of 100 μm, a plurality of first streets 11 are formed parallel to one another in a first direction, and a plurality of second streets 12 are formed parallel to one another in a second direction perpendicular to the first streets 11 on the front surface 10a. A device 13 such as IC, LSI or the like is formed in each of a plurality of areas sectioned by the plurality of first streets 11 and the plurality of second streets 12.

A description is subsequently given of a laser processing method for forming a deteriorated layer in the semiconductor wafer 10 along the first streets 11 and the second streets 12 by applying a laser beam to the above semiconductor wafer 10 along the first streets 11 and the second streets 12.

Figure 4:
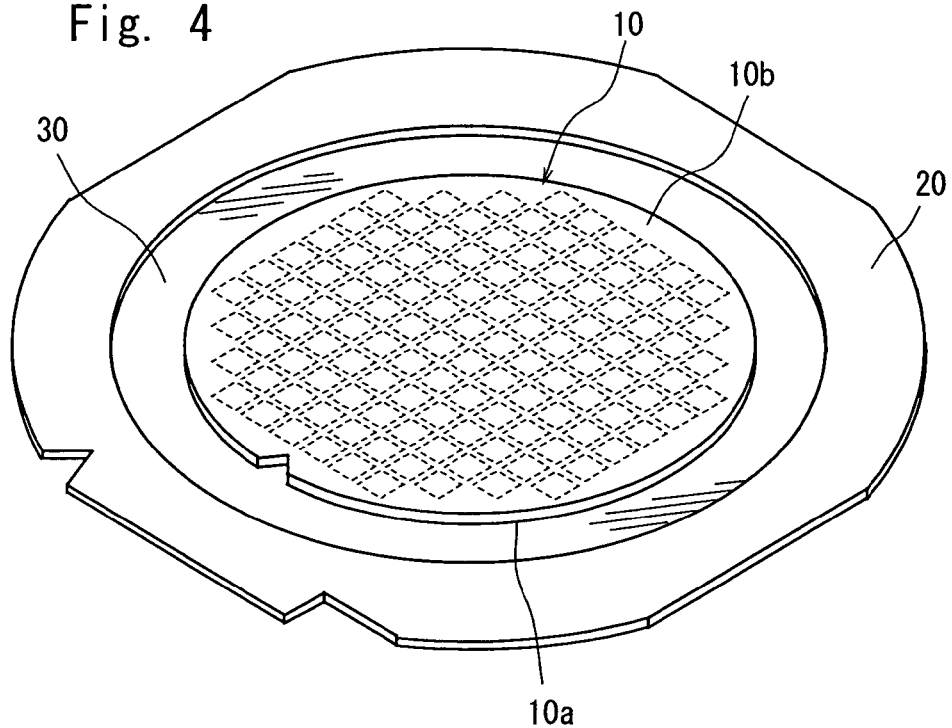
FIG. 4 is a perspective view of the semiconductor wafer shown in FIG. 3 whose front surface is affixed to a protective tape mounted on an annular frame.

The front surface 10a of the above semiconductor wafer 10 is first adhered to a protective tape 30 composed of a synthetic resin sheet such as a polyolefin sheet or the like mounted on an annular frame 20 as shown in FIG. 4. Therefore, the rear surface 10b of the semiconductor wafer 10 faces up.

The protective tape 30 side of the semiconductor wafer 10 supported to the annular frame 20 through the protective tape 30 as shown in FIG. 4 is placed on the chuck table 36 of the laser beam processing machine 1 shown in FIG. 1. The semiconductor wafer 10 is suction held on the chuck table 36 through the protective tape 30 by activating the suction means that is not shown. The annular frame 20 is fixed by the clamps 362.

The chuck table 36 suction holding the semiconductor wafer 10 as described above is positioned right below the image pick-up means 6 by the processing-feed means 37. After the chuck table 36 is positioned right below the image pick-up means 6, alignment work for detecting the area to be processed of the semiconductor wafer 10 is carried out by the image pick-up means 6 and the control means 8. That is, the image pick-up means 6 and the control means 8 carry out image processing such as pattern matching or the like to align the first streets 11 formed in the first direction of the semiconductor wafer 10 with the condenser 524 of the laser beam application means 52 for applying a laser beam along the first streets 11, thereby performing the alignment step of a laser beam application position. The alignment of the laser beam application position is also carried out on the second streets 12 formed on the semiconductor wafer 10. Although the front surface 10a having the first streets 11 and second streets 12 of the semiconductor wafer 10 faces down at this point, as the image pick-up means 6 comprises a infrared illuminating means, an optical system for capturing infrared radiation and an image pick-up device (infrared CCD), etc. for outputting an electric signal corresponding to the infrared radiation as described above, an image of the streets can be picked up through the rear surface 10b.

The above aligning step is followed by a wafer positioning step for making the first streets 11 formed on the semiconductor wafer 10 suction held on the chuck table 36 parallel to the X processing-feed direction. If the first streets 11 are not parallel to the X processing-feed direction, the chuck table 36 suction holding the semiconductor wafer 10 is turned to make the first streets 1 parallel to the X processing-feed direction.

Figure 5:
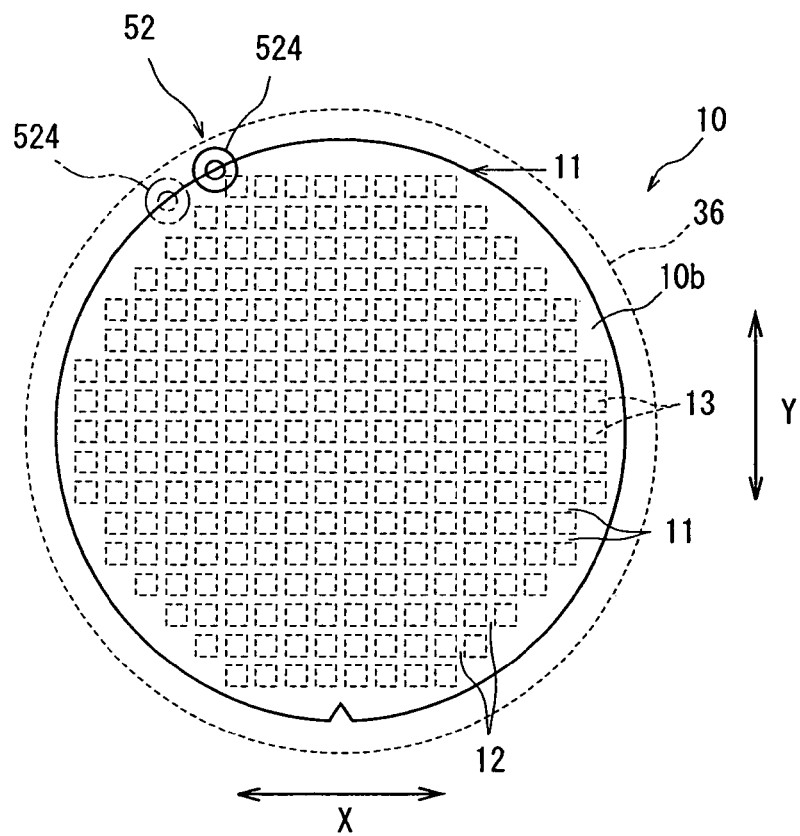
FIG. 5 is a explanatory diagram showing the state that the outermost street on one side in the indexing-feed direction of the wafer is positioned right below a condenser in the first laser processing step in a first embodiment of the wafer laser processing method of the present invention.

After the above wafer positioning step, as shown in FIG. 5, the outermost first street 11 on one side (upper side in FIG. 5) in the Y indexing-feed direction of the semiconductor wafer 10 is positioned right below the condenser 524, and one end (left end in FIG. 5) of the above first street 11 is positioned right below the condenser 524 of the laser beam application means 52. The processing-feed means 37 is then activated to move the chuck table 36 in the processing-feed direction indicated by the arrow X1 at a predetermined processing-feed rate while a pulse laser beam of a wavelength having permeability for the wafer is applied from the condenser 522 of the laser beam application means 52 as shown in FIG. 6(a) (laser beam application step). In this laser beam application step, the focal point P of the pulse laser beam is set to the inside of the semiconductor wafer 10. When the other end of the first street 11 reaches a position right below the condenser 524 as shown in FIG. 6(b), the application of the pulse laser beam is suspended and the movement of the chuck table 36 is stopped. As a result, as shown in FIGS. 6(b) and 6(c), a deteriorated layer 110 is formed in the semiconductor wafer 10 along the first street 11.

The processing conditions in the above laser beam application step are set as follows, for example.

Figure 7:
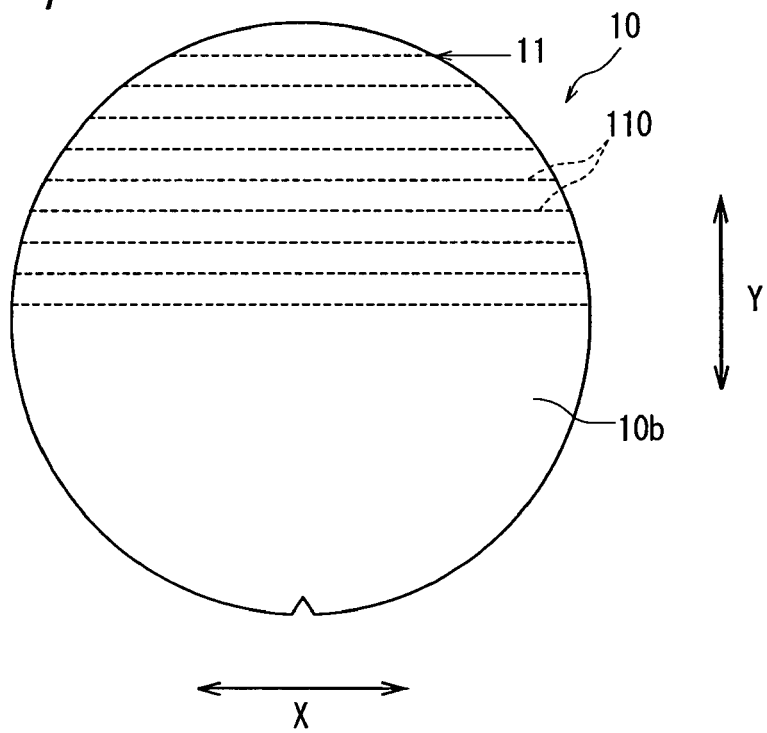
FIG. 7 is a plan view of the semiconductor wafer in which a deteriorated layer has been formed along first streets in the inside by carrying out the first laser processing step in the first embodiment of the wafer laser processing method of the present invention.

Light source: LD excited Q switch Nd:YVO4 laser
Wavelength: pulse laser beam having a wavelength of 1,064 nm
Focal spot diameter: 1 μm
Peak power density at focal point: $3.2 \times 10^{10}$ W/cm$^2$
Cyclic frequency: 100 kHz
Feed rate: 100 mm/sec After the laser beam application step is carried out along the first street 11, next comes an indexing-feed step for positioning a first street 11 adjacent to the first street 11 which has undergone the above laser beam application step on the semiconductor wafer 10 held on the chuck table 36 right below the condenser 524 indicated by a two-dot chain line in FIG. 5 by activating the first indexing-feed means 38 to move the chuck table 36 a distance corresponding to the interval between the first streets 11 in the indexing-feed direction (upward direction in the embodiment shown in FIG. 5). By carrying out the above laser beam application step and the indexing-feed step sequentially, a deteriorated layer 110 is formed along first streets 11 in one half area of the semiconductor wafer 10 as shown in FIG. 7 (first laser processing step).

When the above laser beam application step is carried out, the semiconductor wafer 10 slightly expands in the direction (Y direction) perpendicular to the first streets 11 where the deteriorated layer 110 has been formed. As a result, the semiconductor wafer 10 mounted on the protective tape 30 displaces in the Y direction. Since the semiconductor wafer 10 displaces to the side having a relatively small area and the step of applying a laser beam along a first street 11 in the largest center area comes last in the first laser processing step, the position relationship between the focal point of the laser beam and the first streets 11 does not deviate cumulatively. Therefore, when alignment between the first street 11 and the focal point of a laser beam applied from the condenser 524 is first carried out, displacement caused by the expansion of the wafer due to the application of a laser beam does not need to be compensated for during the first laser processing step.

Figure 8:
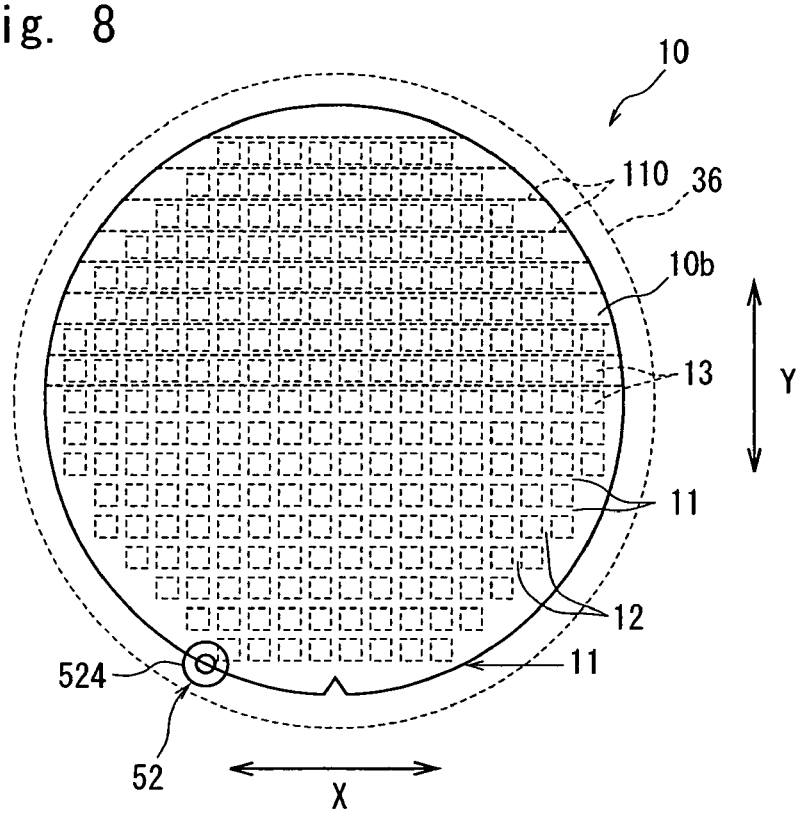
FIG. 8 is a explanatory diagram showing the state that the outermost street on the other side in the indexing-feed direction is positioned right below the condenser in the indexing-feed direction of the wafer under the second laser processing step in the first embodiment of the wafer laser processing method of the present invention.
Figure 9:
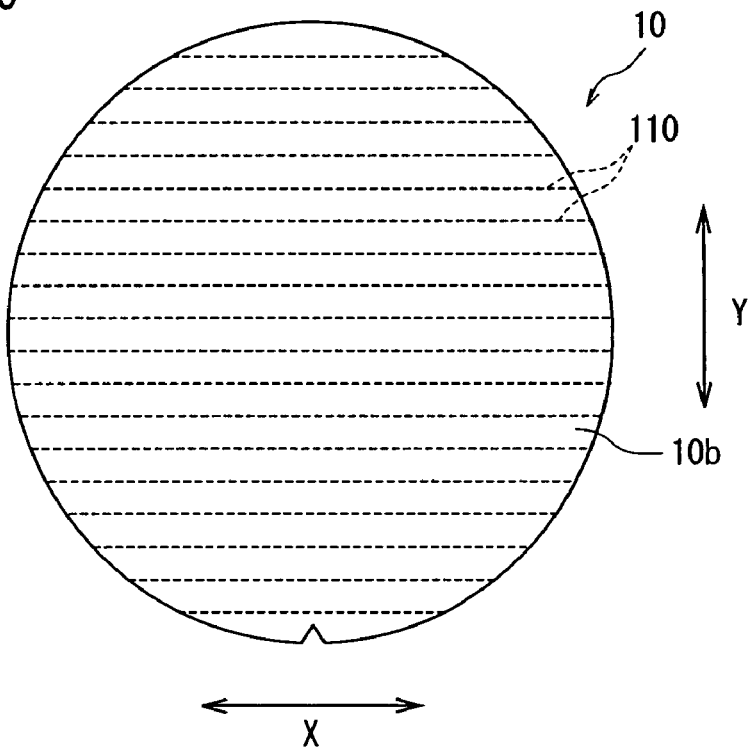
FIG. 9 is a plan view of the semiconductor wafer in which a deteriorated layer has been formed along the first streets in the inside by carrying out the first laser processing step and the second laser processing step in the first embodiment of the wafer laser processing method along the first streets formed on the semiconductor wafer.

After the above first laser processing step, as shown in FIG. 8, the outermost first street 11 on the other side (lower side in FIG. 8) in the Y indexing-feed direction of the semiconductor wafer 10 is positioned right below the condenser 524, and one end (left end in FIG. 8) of the first street 11 is positioned right below the condenser 524 of the laser beam application means 52. By carrying the above laser beam application step and the indexing-feed step sequentially, a deteriorated layer 110 is formed along first streets 11 formed in the other half area of the semiconductor wafer 10 as shown in FIG. 9 (second laser processing step).

Since the step of applying a laser beam along a first street 11 in the largest center area comes last even in this second laser processing step, the position relationship between the focal point of the laser beam and the first streets 11 does not deviate cumulatively. Therefore, when alignment between the first street 11 and the focal point of a laser beam applied from the condenser 524 is first carried out, displacement caused by the expansion of the wafer due to the application of a laser beam does not need to be compensated for during the second laser processing step.

When alignment between the first street 11 and the focal point of a laser beam applied from the condenser 524 is first carried out as described above, displacement caused by the expansion of the wafer due to the application of a laser beam does not need to be compensated for during the first laser processing step and the second laser processing step, thereby making it possible to increase productivity.

After the deteriorated layer 110 is formed in the semiconductor wafer 10 along the plurality of first streets 11 by carrying out the first laser processing step and the second laser processing step along the first streets 11 formed in the first direction of the semiconductor wafer 10 as described above, next comes a wafer position step for making the second streets 12 formed in the direction perpendicular to the first streets 11 parallel to the X processing-feed direction by turning the chuck table 36 at 90° to turn the semiconductor wafer 10 held on the chuck table 36 at 90°.

Figure 10:
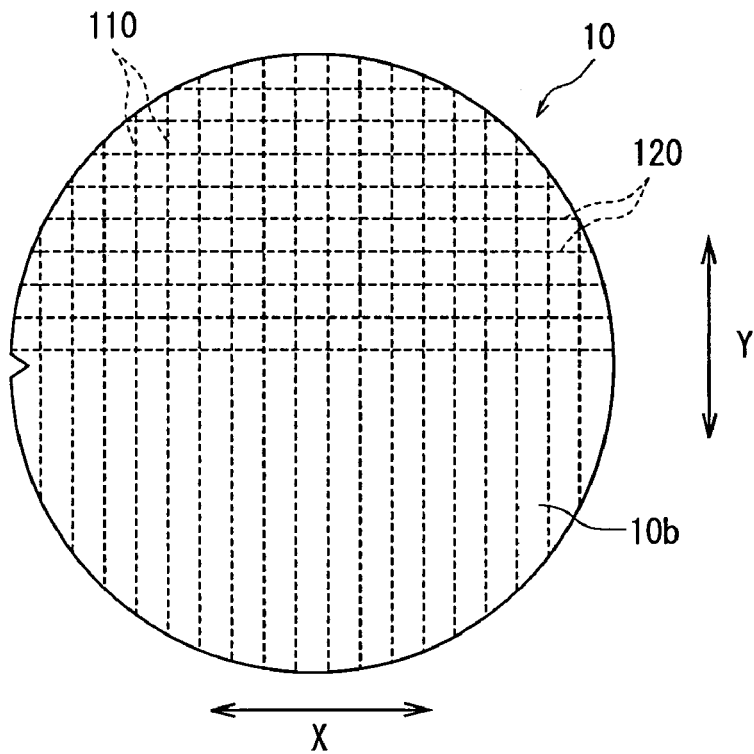
FIG. 10 is a plan view of the semiconductor wafer in which a deteriorated layer has been formed along second streets in the inside by carrying out the first laser processing step in the first embodiment of the wafer laser processing method of the present invention along the second streets formed on the semiconductor wafer.
Figure 11:
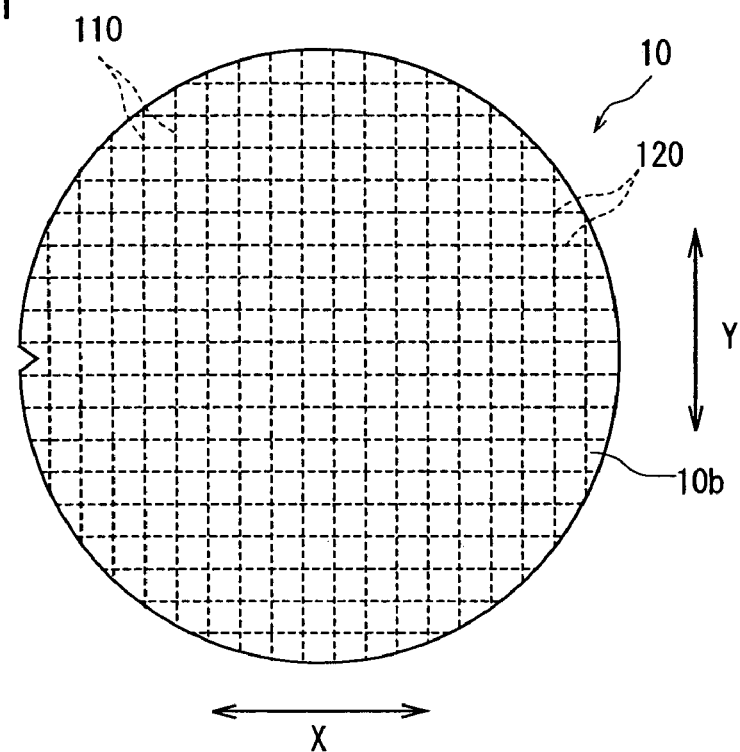
FIG. 11 is a plan view of the semiconductor wafer in which a deteriorated layer has been formed along the second streets in the inside by carrying out the first laser processing step and the second laser processing step in the first embodiment of the wafer laser processing method of the present invention along the second streets formed on the semiconductor wafer.

By carrying out the above first laser processing step, a deteriorated layer 120 is formed along second streets 12 formed in one half area (upper area in FIG. 10) of the semiconductor wafer 10 as shown in FIG. 10. Thereafter, by carrying out the above second laser processing step, a deteriorated layer 120 is formed along second streets 12 formed in the other half area (lower area in FIG. 10) of the semiconductor wafer 10 as shown in FIG. 11.

The semiconductor wafer 10 in which the deteriorated layer 110 has been formed along the first streets 11 and the deteriorated layer 120 has been formed along the second streets 12 is carried to the subsequent dividing step. In this dividing step, external force is applied along the first streets 11 where the deteriorated layer 110 has been formed and along the second streets 12 where the deteriorated layer 120 has been formed to divide the semiconductor wafer 10 into individual devices along the first streets 11 and the second streets 12.

A description is subsequently given of a laser processing method for forming grooves in the semiconductor wafer 10 along the first streets 11 and the second streets 12 by applying a laser beam to the semiconductor wafer 10 shown in FIG. 3 along the first streets 11 and the second streets 12.

Figure 12:
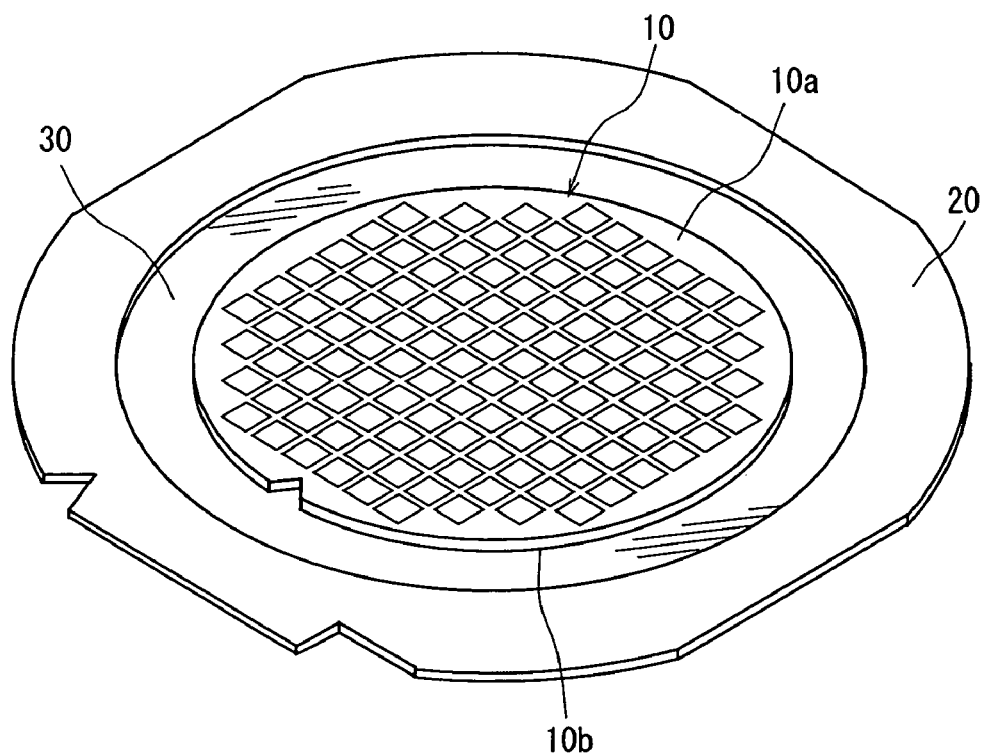
FIG. 12 is a perspective view showing the state that the rear surface of the semiconductor wafer shown in FIG. 3 is affixed to the protective tape mounted on the annular frame.

To form the grooves in the semiconductor wafer 10 along the first streets 11 and the second streets 12, the rear surface 10b of the semiconductor wafer 10 is put on the protective tape 30 composed of a synthetic resin sheet such as a polyolefin sheet and the like mounted on the annular frame 20 as shown in FIG. 12. Therefore, the front surface 10a of the semiconductor wafer 10 faces up.

The protective tape 30 side of the semiconductor wafer 10 supported to the annular frame 20 through the protective tape 30 as shown in FIG. 12 is placed on the chuck table 36 of the laser beam processing machine 1 shown in FIG. 1. The semiconductor wafer 10 is suction held on the chuck table 36 through the protective tape 30 by activating the suction means that is not shown. The annular frame 20 is fixed by the clamps 362.

The chuck table 36 suction holding the semiconductor wafer 10 as described above is positioned right below the image pick-up means 6 by the processing-feed means 37. Alignment work for detecting the area to be processed of the semiconductor wafer 10 is then carried out. After the alignment work, next comes a wafer positioning step for making the first streets 11 formed on the semiconductor wafer 10 suction held on the chuck table 36 parallel to the X processing-feed direction.

Figure 13:
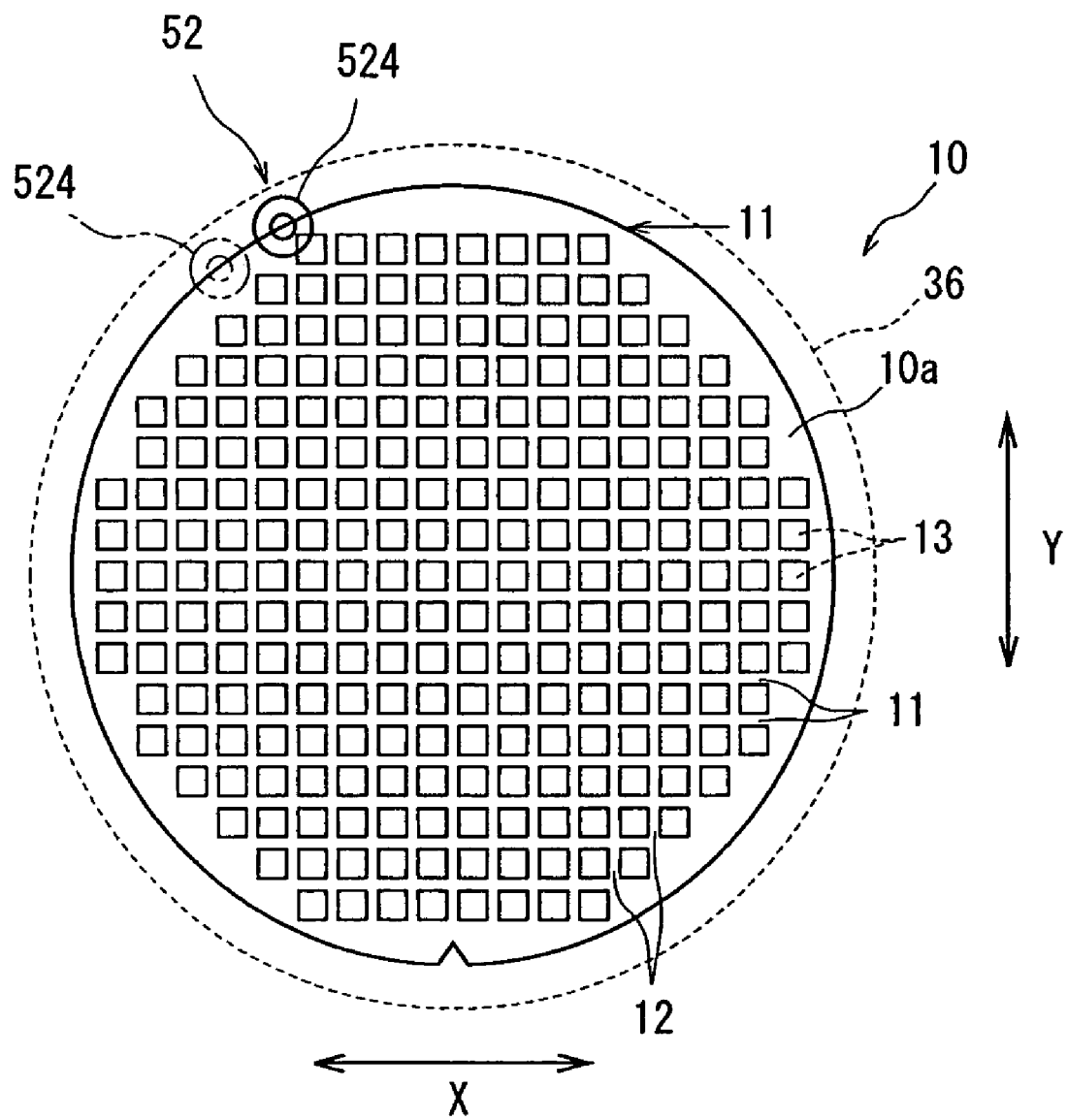
FIG. 13 is a explanatory diagram showing the state that the outermost street on one side in the indexing-feed direction of the wafer is positioned right below the condenser in the first laser processing step in a second embodiment of the wafer laser processing method of the present invention.
Figure 14:
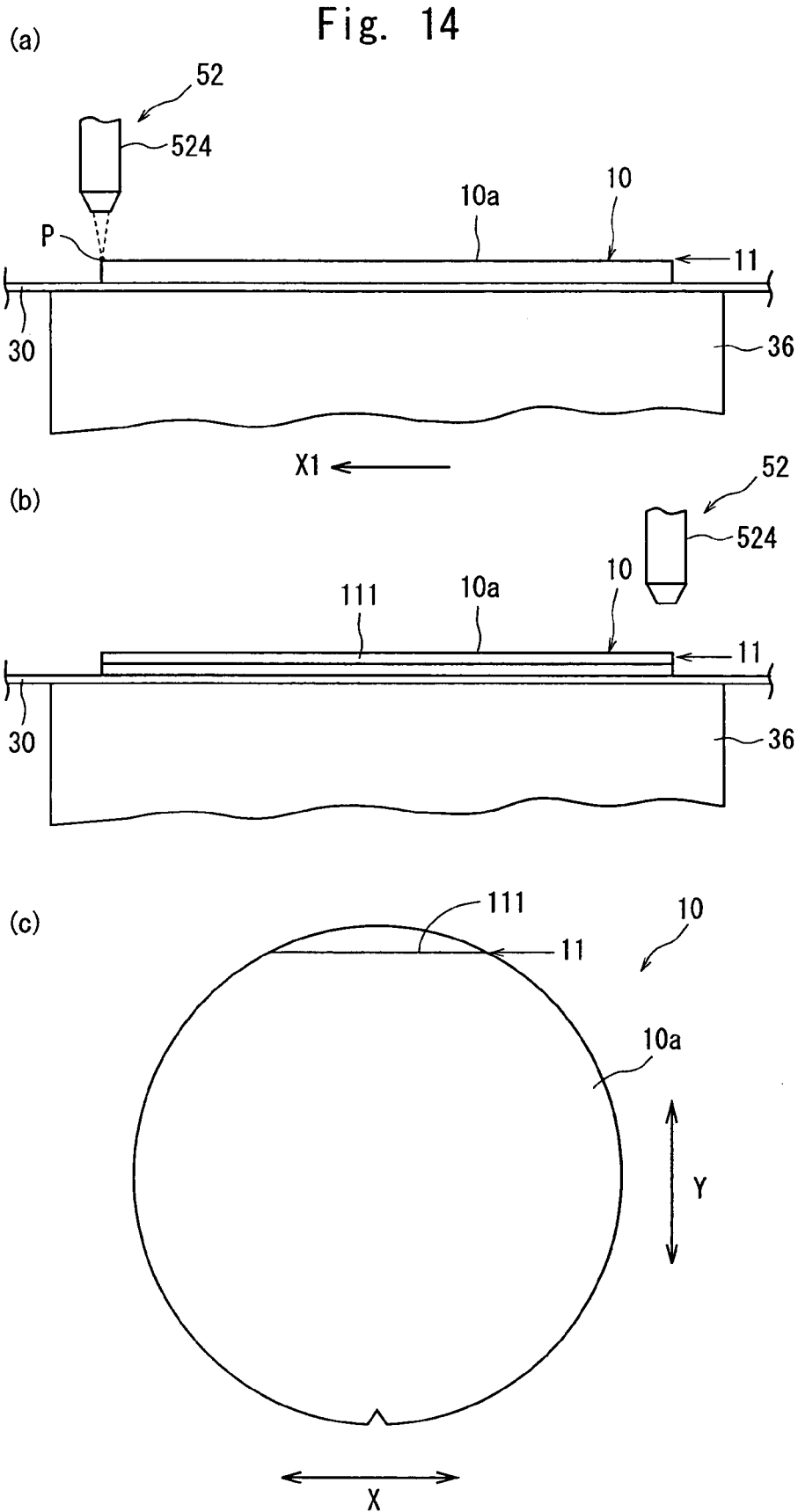
FIGS. 14(a), 14(b) and 14(c) are explanatory diagrams of the laser beam application step in the first laser processing step in the second embodiment of the wafer laser processing method of the present invention.

After the above wafer positioning step, the outermost first street 11 on one side (upper side in FIG. 13) in the Y indexing-feed direction of the semiconductor wafer 10 is positioned right below the condenser 524, and one end (left end in FIG. 13) of the above first street 11 is positioned right below the condenser 524 of the laser beam application means 52. The processing-feed means 37 is then activated to move the chuck table 36 in the processing-feed direction indicated by the arrow X1 at a predetermined processing-feed rate while a pulse laser beam of a wavelength having absorptivity for the wafer is applied from the condenser 524 of the laser beam application means 52 as shown in FIG. 14(a) (laser beam application step). In this laser beam application step, the focal point P of the pulse laser beam is set to a position near the top surface (front surface 10a) of the semiconductor wafer 10. When the other end of the first street 11 reaches a position right below the condenser 524 as shown in FIG. 14(b), the application of the pulse laser beam is suspended and the movement of the chuck table 36 is stopped. As a result, as shown in FIGS. 14(b) and 14(c), a groove 111 having a predetermined depth from the top surface (front surface 10a) is formed in the semiconductor wafer 10 along the first street 11.

The above laser beam application step is carried out under the following processing conditions, for example.

Figure 15:
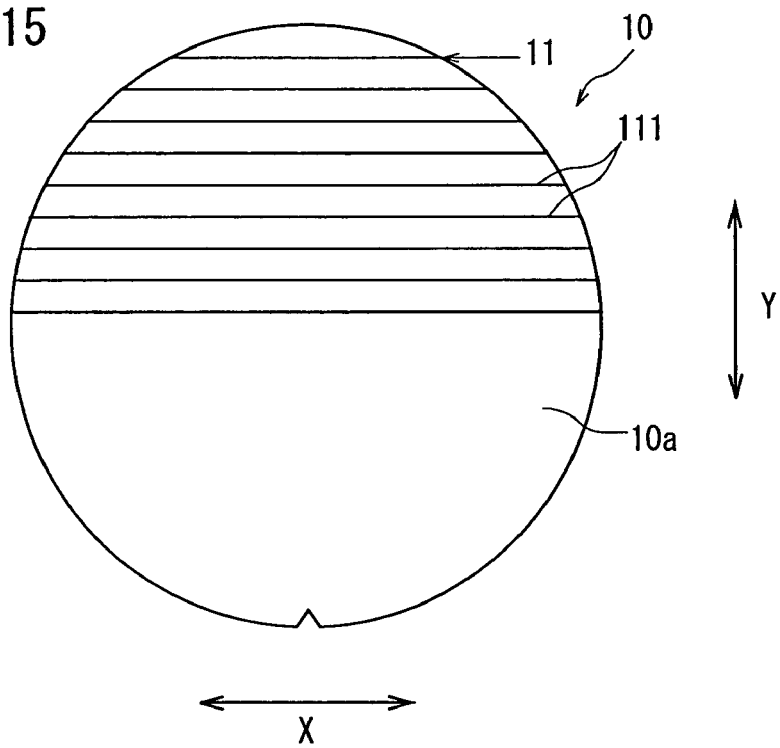
FIG. 15 is a plan view of the semiconductor wafer in which a groove has been formed along first streets by carrying out the first laser processing step in the second embodiment of the wafer laser processing method of the present invention.

Light source of laser beam: YVO4 laser or YAG laser
Wavelength: 355 nm
Average output: 1 to 5 W
Cyclic frequency: 30 to 100 kHz
Focal spot diameter: 10 to 20 μm
Feed rate: 100 mm/sec After the laser beam application step is carried out along the first street 11 as described above, next comes an indexing-feed step for positioning a first street 11 adjacent to the first street 11 which has undergone the above laser beam application step on the semiconductor wafer 10 held on the chuck table 36 right below the condenser 524 indicated by the two-dot chain line in FIG. 13 by activating the first indexing-feed means 38 to move the chuck table 36 a distance corresponding to the interval between the first streets 11 in the indexing-feed direction. By carrying out the above laser beam application step and the indexing-feed step sequentially, a groove 111 having a predetermined depth from the front surface 10a is formed along first streets 11 in one half area of the semiconductor wafer 10 as shown in FIG. 15 (first laser processing step).

When the above laser beam application step is carried out, the semiconductor wafer 10 slightly expands in the direction (Y direction) perpendicular to the first streets 11 where the groove 111 has been formed. As a result, the semiconductor wafer 10 mounted on the protective tape 30 displaces in the Y direction. Since the semiconductor wafer 10 displaces to the side having a relatively small area and the step of applying a laser beam along a first street 11 in the largest center area comes last in the first laser processing step, the position relationship between the focal point of a laser beam and the first streets 11 does not change cumulatively. Therefore, when alignment between the first street 11 and the focal point of a laser beam applied from the condenser 524 is first carried out, displacement caused by the expansion of the wafer due to the application of a laser beam does not need to be compensated for during the first laser processing step.

Figure 16:
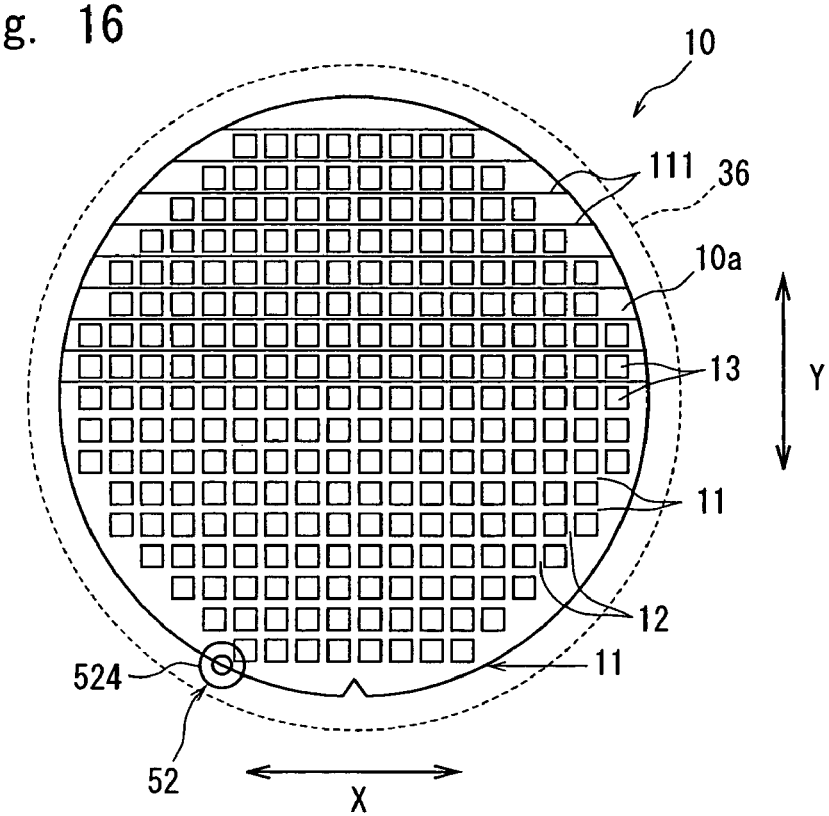
FIG. 16 is a explanatory diagram showing the state that the outermost street on the other side in the indexing-feed direction of the wafer is positioned right below the condenser in the second laser processing step in the second embodiment of the wafer laser processing method of the present invention.
Figure 17:
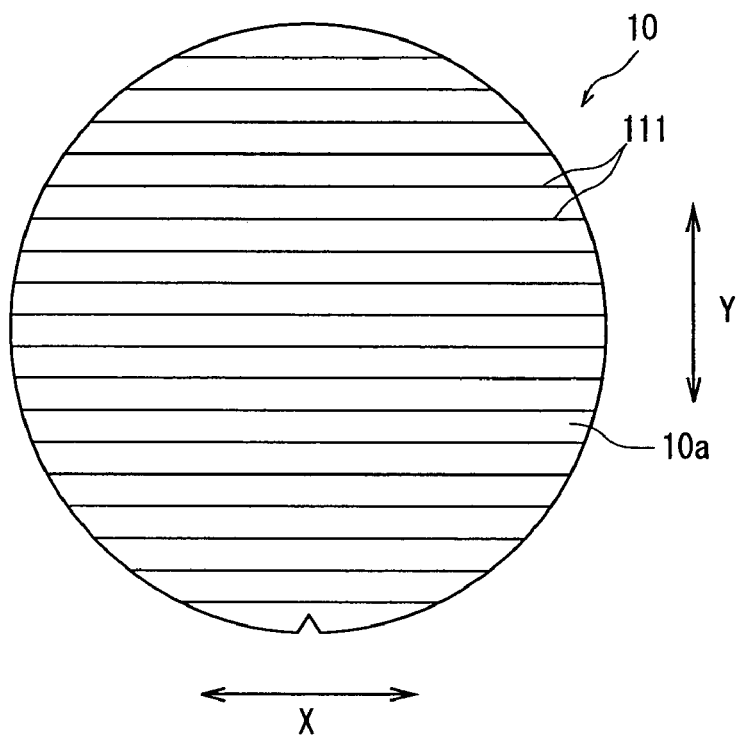
FIG. 17 is a plan view of the semiconductor wafer in which a groove has been formed along the first streets by carrying out the first laser processing step and the second laser processing step in the second embodiment of the wafer laser processing method of the present invention along the first streets formed on the semiconductor wafer.

After the above first laser processing step, as shown in FIG. 16, the outermost first street 11 on the other side (lower side in FIG. 16) in the Y indexing-feed direction of the semiconductor wafer 10 is positioned right below the condenser 524, and one end (left end in FIG. 16) of the above first street 11 is positioned right below the condenser 524 of the laser beam application means 52 as shown in FIG. 16. By carrying out the above laser beam application step and the indexing-feed step sequentially, a groove 111 having a predetermined depth from the front surface 10a is formed along first streets 11 formed in the other half area of the semiconductor wafer 10 as shown in FIG. 17.

Since the step of applying a laser beam along a first street 11 in the largest center area comes last even in this second laser processing step, the position relationship between the focal point of a laser beam and the first streets 11 does not deviate cumulatively. Therefore, when alignment between the first street 11 and the focal point of a laser beam applied from the condenser 524 is first carried out, displacement caused by the expansion of the wafer due to the application of a laser beam does not need to be compensated for during the second laser processing step.

When alignment between the first street 11 and the focal point of a laser beam applied from the condenser 524 is first carried out, displacement caused by the expansion of the wafer due to the application of a laser beam does not need to be compensated for during the first laser processing step and the second laser processing step, thereby making it possible to increase productivity.

After the groove 111 is formed in the semiconductor wafer 10 along the plurality of first streets 11 by carrying out the first laser processing step and the second laser processing step along the first streets 11 formed in the first direction of the semiconductor wafer 10, next comes a wafer positioning step for making the second streets 12 formed in the direction perpendicular to the first streets 11 parallel to the X processing-feed direction by turning the chuck table 36 at 90° to turn the semiconductor wafer 10 held on the chuck table 36 at 90°.

Figure 18:
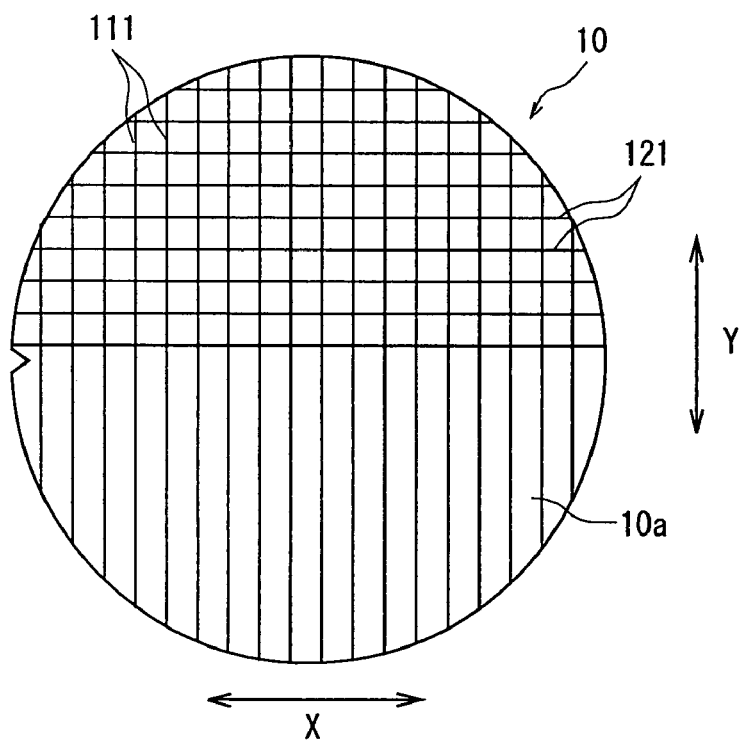
FIG. 18 is a plan view of the semiconductor wafer in which a laser processed groove has been formed along second streets by carrying out the first laser processing step in the second embodiment of the wafer laser processing method of the present invention along the second streets formed on the semiconductor wafer.
Figure 19:
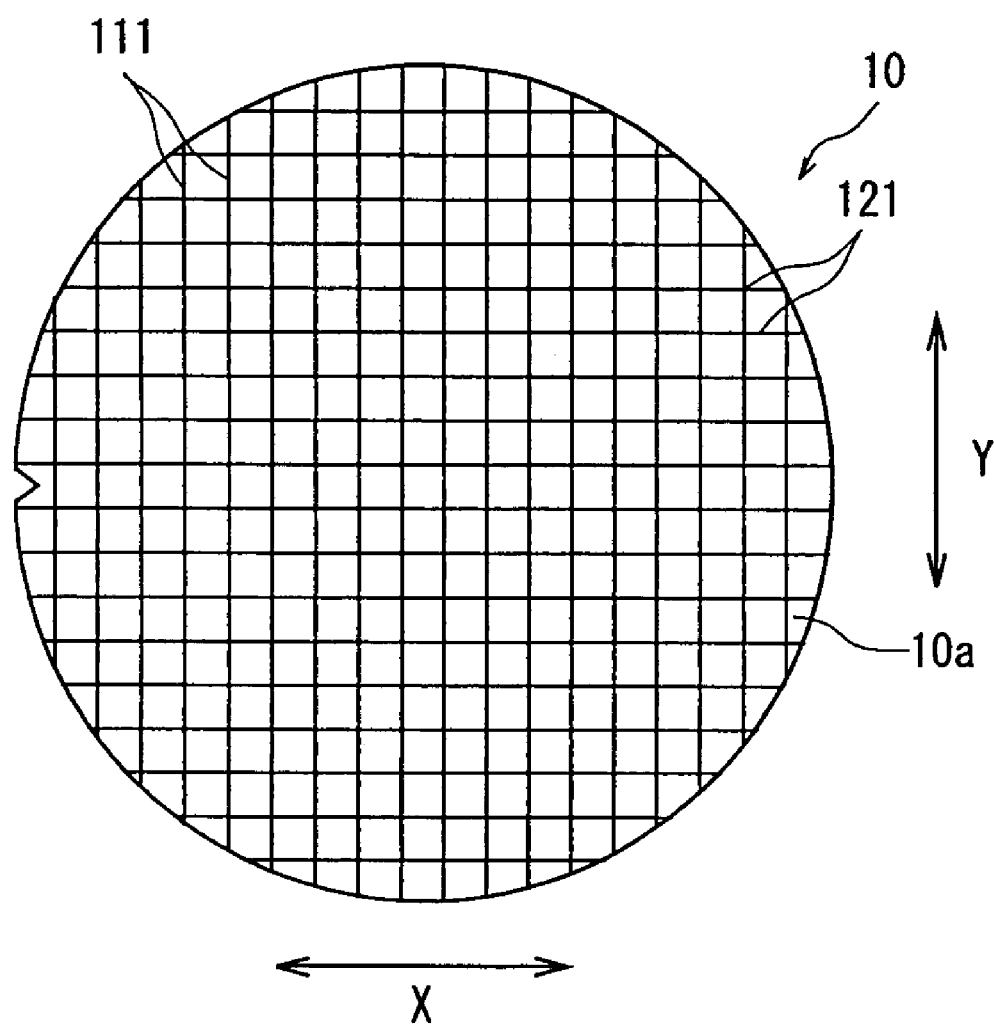
FIG. 19 is a plan view of the semiconductor wafer in which a groove has been formed along the second streets by carrying out the first laser processing step and the second laser processing step in the second embodiment of the wafer laser processing method of the present invention along the second streets formed on the semiconductor wafer.

By carrying out the above first laser processing step, a groove 121 is formed along second streets 12 formed in one half area (upper area in FIG. 18) of the semiconductor wafer 10 as shown in FIG. 18. Thereafter, by carrying out the above second laser processing step, a groove 121 is formed along second streets 12 formed in the other half area (lower area in FIG. 19) of the semiconductor wafer 10 as shown in FIG. 19.

The semiconductor wafer 10 in which the groove 111 has been formed along the first streets 11 and the groove 121 has been formed along the second streets 12 as described above is carried to the subsequent dividing step. In this dividing step, external force is applied along the first streets 11 where the groove 111 has been formed and along the second streets 12 where the groove 121 has been formed to divide the semiconductor wafer 10 into individual devices along the first streets 11 and the second streets 12.

What is claimed is:

1. A method of carrying out laser processing on a wafer having a plurality of parallel streets on a front surface, along the streets, including a wafer holding step of affixing a protective member to the front surface or rear surface of the wafer and holding the protective member side of the wafer on a rotatable chuck table and a wafer positioning step of making streets formed on the wafer positioning step of making streets formed on the wafer held on the chuck table parallel to a feed direction, by using a laser beam processing machine comprising the rotatable chuck table for holding the wafer, a laser beam application means comprising a condenser for applying a laser beam to the wafer held on the chuck table, a processing-feed means for moving the chuck table and the laser beam application means relative to each other in a processing-feed direction, and an indexing-feed means for moving the chuck table and the laser beam application means in an indexing-feed direction perpendicular to the processing feed direction, the method further comprising:

a first laser processing step of carrying out laser processing along streets formed in one half of an area of the wafer by carrying out a laser beam application step for carrying out laser processing along the streets by positioning the outermost street on one side in the indexing-feed direction of the wafer which has undergone the wafer positioning step right below the condenser and moving the chuck table in the processing-feed direction by activating the processing-feed means while a laser beam is applied from the condenser and an indexing-feed step for positioning a street inwardly adjacent to the street which has undergone the laser beam application step on the wafer held on the chuck table right below the condenser by activating the indexing-feed means sequentially toward inward streets; and a second laser processing step of carrying out laser processing along streets formed in the other half of an area of the wafer by carrying out a laser beam application step for carrying out laser processing along the streets by positioning the outermost street on the other side in the indexing-feed direction of the wafer which has undergone the first laser processing step right below the condenser and moving the chuck table in the processing-feed direction by activating the processing-feed means while a laser beam is applied from the condenser and an indexing-feed step for positioning a street inwardly adjacent to the street which has undergone the laser beam application step on the wafer held on the chuck table right below the condenser by activating the indexing-feed means sequentially toward inward streets and in a parallel direction with the streets on one side.

2. The wafer laser processing method according to claim 1, wherein the plurality of parallel streets formed on the wafer consist of first streets formed in a first direction and second streets formed in a second direction perpendicular to the first streets.

3. The wafer laser processing method according to claim 1, wherein the laser beam application means applies a laser beam of a wavelength having permeability for the wafer in the laser beam application step with its focal point set to the inside of the wafer to form a deteriorated layer along the streets in the wafer.

4. The wafer laser processing method according to claim 1, wherein the laser beam application means applies a laser beam of a wavelength having absorptivity for the wafer in the laser beam application step to form a groove along the streets in the wafer.

5. The wafer laser processing method according to claim 1, wherein the first and second laser processing steps are sequentially carried out from a relatively narrow area to a relatively broader area of the wafer.

6. The wafer laser processing method according to claim 1, wherein the plurality of parallel streets formed on the wafer consist of first streets formed in a first direction and second streets formed in a second direction perpendicular to the first streets; and the laser beam application means applies a laser beam of a wavelength having permeability for the wafer in the laser beam application step with its focal point set to the inside of the wafer to form a deteriorated layer along the streets in the wafer as well as having an absorptivity for the wafer in the laser beam application step to form a groove along the streets in the wafer.

* * * * *